United States Patent
Earhart

(10) Patent No.: US 9,997,251 B2
(45) Date of Patent: Jun. 12, 2018

(54) MEDIUM DEFECT MANAGEMENT METHOD FOR STORAGE SYSTEMS REQUIRING AN INTEGRATED CONTROLLER

(71) Applicant: Burlywood, LLC, Longmont, CO (US)

(72) Inventor: Tod R. Earhart, Longmont, CO (US)

(73) Assignee: Burlywood, LLC, Longmont, CO (US)

( * ) Notice: Subject to any disclaimer, the term of this patent is extended or adjusted under 35 U.S.C. 154(b) by 26 days.

(21) Appl. No.: 15/075,169

(22) Filed: Mar. 20, 2016

(65) Prior Publication Data

US 2016/0283308 A1 Sep. 29, 2016

Related U.S. Application Data

(60) Provisional application No. 62/138,751, filed on Mar. 26, 2015.

(51) Int. Cl.
*G11C 16/26* (2006.01)
*G11C 16/10* (2006.01)
*G11C 7/10* (2006.01)
*G06F 11/08* (2006.01)
*G11C 16/30* (2006.01)

(52) U.S. Cl.
CPC .............. *G11C 16/26* (2013.01); *G06F 11/08* (2013.01); *G11C 7/1063* (2013.01); *G11C 16/10* (2013.01)

(58) Field of Classification Search
CPC ..... G11C 16/26; G11C 16/3436; G11C 16/34; G11C 7/1063; G11C 16/10; G06F 11/08
See application file for complete search history.

(56) References Cited

U.S. PATENT DOCUMENTS

| 5,263,032 | A | * | 11/1993 | Porter | .............. G06F 11/106 714/710 |
| 6,052,797 | A | * | 4/2000 | Ofek | ............... G06F 11/2064 709/219 |
| 6,202,124 | B1 | | 3/2001 | Kern et al. | |
| 6,915,379 | B2 | | 7/2005 | Honda et al. | |
| 7,424,582 | B2 | | 9/2008 | Takayama et al. | |
| 7,908,408 | B2 | | 3/2011 | Kono | |
| 8,433,977 | B1 | | 4/2013 | Vasquez et al. | |
| 8,656,074 | B2 | | 2/2014 | Lai et al. | |
| 8,930,599 | B2 | | 1/2015 | Lai et al. | |
| 8,972,824 | B1 | | 3/2015 | Northcott et al. | |
| 2005/0091425 | A1 | * | 4/2005 | Wyatt | ................. G06F 1/3203 710/33 |

(Continued)

*Primary Examiner* — April Y Blair
*Assistant Examiner* — Dipakkumar Gandhi

(57) ABSTRACT

A method of operating a storage controller is provided. The method includes receiving host data for storage within a storage system, the storage system configured as a plurality of sequentially numbered data blocks, each comprising a plurality of pages, storing the host data in a data buffer, and organizing the host data into storage data pages. The method also includes sequentially writing the storage data into page stripes, reading the storage data from the pages, and comparing the read storage data with the host data stored in the data buffer. The method further includes for each page of storage data that fails the comparison, rewriting the storage data for that page into a different page, and when at least some of the storage data within the storage system passes the comparison, transmitting a signal to the host.

20 Claims, 10 Drawing Sheets

(56) References Cited

U.S. PATENT DOCUMENTS

| | | | |
|---|---|---|---|
| 2006/0085670 A1* | 4/2006 | Carver | G06F 11/1008 714/6.13 |
| 2006/0126394 A1 | 6/2006 | Li | |
| 2006/0206680 A1 | 9/2006 | Yamanaka et al. | |
| 2007/0283093 A1 | 12/2007 | Lohar et al. | |
| 2008/0008001 A1* | 1/2008 | Kuroyanagi | G06F 11/1068 365/185.11 |
| 2008/0137415 A1* | 6/2008 | Lee | G11C 11/5628 365/185.03 |
| 2008/0162826 A1 | 7/2008 | Okamoto et al. | |
| 2009/0172499 A1 | 7/2009 | Olbrich et al. | |
| 2009/0276586 A1* | 11/2009 | Royer | G06F 12/0246 711/154 |
| 2011/0029726 A1 | 2/2011 | Fujimoto | |
| 2011/0096603 A1 | 4/2011 | Lasser | |
| 2011/0149651 A1 | 6/2011 | Gorobets et al. | |
| 2011/0258391 A1 | 10/2011 | Atkisson et al. | |
| 2011/0314354 A1 | 12/2011 | Fillingim | |
| 2012/0278512 A1* | 11/2012 | Alatorre | G06F 3/0605 710/33 |
| 2013/0055254 A1* | 2/2013 | Avasthi | G06F 9/45533 718/1 |
| 2014/0095827 A1 | 4/2014 | Wei et al. | |
| 2014/0143474 A1* | 5/2014 | Damle | G06F 12/0246 711/103 |
| 2014/0192583 A1 | 7/2014 | Rajan et al. | |
| 2014/0208004 A1 | 7/2014 | Cohen et al. | |
| 2014/0237298 A1* | 8/2014 | Pe'er | G11C 16/3418 714/42 |
| 2015/0012794 A1 | 1/2015 | Losh et al. | |
| 2015/0067418 A1* | 3/2015 | Lee | G06F 11/263 714/720 |
| 2015/0082014 A1 | 3/2015 | Funaki et al. | |
| 2015/0154061 A1* | 6/2015 | Camp | G06F 11/1012 714/6.13 |
| 2016/0274800 A1 | 9/2016 | Earhart | |
| 2016/0274970 A1 | 9/2016 | Earhart | |
| 2016/0283308 A1 | 9/2016 | Earhart | |

* cited by examiner

MEDIUM DEFECT MANAGEMENT METHOD FOR STORAGE SYSTEMS REQUIRING AN INTEGRATED CONTROLLER

RELATED APPLICATIONS

This application hereby claims the benefit of and priority to U.S. Provisional Patent Application No. 62/138,751, titled "A MEDIUM DEFECT MANAGEMENT ALGORITHM FOR STORAGE SYSTEMS REQUIRING AN INTEGRATED CONTROLLER", filed on Mar. 26, 2015 and which is hereby incorporated by reference in its entirety.

TECHNICAL FIELD

Aspects of the disclosure are related to data storage and in particular to sequential write/random read storage controllers.

TECHNICAL BACKGROUND

All storage media has defects that must be accounted for in the storage system design. In most cases, there are both manufacturing defects and grown defects. Manufacturing defects are due to imperfections and errors in the manufacturing process. Grown defects are discovered during use and are normally caused by wear, debris, impact, long term migration, aging or other processes.

Each type of storage technology has its own properties, defect causes, and characteristics. For media types that employ an integrated control function (such as Hard Disk Drives (HDDs), Solid State Drives (SSDs), USB (Universal Serial Bus) Flash, . . . ), the medium is typically tested during the manufacturing process and areas with defects that are significant enough to cause degradation or data loss are marked as bad using a method compatible with the media type and storage control system. Most storage systems also have methods of detecting grown defects during operation either before or after medium usage.

Not all defects can be avoided, so most storage systems implement some type of error correction algorithm in order to recover data that has errors. By avoiding areas of the medium that contains defects, the ECC effectiveness is increased.

OVERVIEW

In an embodiment, a storage controller for a storage system is provided. The storage controller includes a host interface, configured to receive host data for storage within the storage system, a storage interface, configured to transmit storage data to the storage system using a sequential write/random read traffic model, and processing circuitry coupled with the host interface and the storage interface. The storage system is configured to store data in a plurality of sequentially numbered data blocks, each data block comprising a plurality of pages.

The processing circuitry is configured to receive host data from a host, through the host interface, for storage within the storage system, store the host data in a data buffer, and to organize the host data into pages of storage data. The processing circuitry is further configured to sequentially write the storage data into page stripes within the plurality of sequentially numbered data blocks through the storage interface, read the storage data from the pages within the plurality of sequentially numbered data blocks through the storage interface, and to compare the read storage data with the host data stored in the data buffer. The processing circuitry is also configured to rewrite the storage data for that page into a different page than the page in which it was previously stored for each page of storage data that fails the comparison, and to transmit a signal to the host through the host interface when at least some of the storage data within the storage system passes the comparison.

In another embodiment, a method of operating a storage controller is provided. The method includes receiving host data from a host, through a host interface, for storage within a storage system, the storage system configured to store data in a plurality of sequentially numbered data blocks, each data block comprising a plurality of pages, storing the host data in a data buffer, and organizing the host data into pages of storage data. The method also includes sequentially writing the storage data into page stripes within the plurality of sequentially numbered data blocks through a storage interface using a sequential write/random read traffic model, reading the storage data from the pages within the plurality of sequentially numbered data blocks through the storage interface, and comparing the read storage data with the host data stored in the data buffer.

The method further includes rewriting the storage data for that page into a different page than the page in which it was previously stored for each page of storage data that fails the comparison, and transmitting a signal to the host through the host interface when at least some of the storage data within the storage system passes the comparison.

In a further embodiment, one or more non-transitory computer-readable media having stored thereon program instructions to operate a storage controller for a storage system are provided. The program instructions, when executed by processing circuitry, direct the processing circuitry to at least receive host data from a host, through a host interface, for storage within the storage system, the storage system configured to store data in a plurality of sequentially numbered data blocks, each data block comprising a plurality of pages, store the host data in a data buffer, and organize the host data into pages of storage data.

The program instructions further direct the processing circuitry to at least sequentially write the storage data into page stripes within the plurality of sequentially numbered data blocks through a storage interface configured to transmit storage data to the storage system using a sequential write/random read traffic model, read the storage data from the pages within the plurality of sequentially numbered data blocks through the storage interface, and compare the read storage data with the host data stored in the data buffer. The program instructions also direct the processing circuitry to at least rewrite the storage data for that page into a different page than the page in which it was previously stored for each page of storage data that fails the comparison, and to transmit a signal to the host through the host interface when at least some of the storage data within the storage system passes the comparison.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

As one of the most common storage devices, hard disk drives have standardized their defect management within the manufacturing process. HDDs write and read in sectors, which are areas of the disk containing 512 bytes of user data plus ECC. More rarely, there are also versions supporting 4K bytes of user data.

The medium within a HDD is segregated into multiple areas. Areas pertaining to medium defect management include the system area, user data area, and sparing area. The system area is used for internal data storage and is only accessed by the internal drive controller. The sparing area is reserved for grown defects discovered during operation over the life of the drive.

The circular tracks of the disk are made up of sectors. During the manufacturing process, all of the disk surfaces in a drive are written to and checked for defects. The sectors having errors crossing a specific threshold are listed as bad in a table. That table is stored redundantly in the system area.

The host interface addresses data in logical block numbers which are typically 512 bytes. Each logical block is assigned to a sector in the system data area. The assignments are made after the manufacturing medium test process, skipping all defective sectors.

Once in use, write operations look up the sector mapping based on the logical block address and write to the target sector.

During reads, if a recoverable error is encountered or a read threshold is exceeded, the sector can be added to the bad sector table as a grown defect. If that is done, a spare sector is allocated from the sparing area, the data is moved to the spare sector, and the spare sector is assigned the address of the logical block that was associated with the bad sector.

If the data is unrecoverable, a spare sector may be allocated as a replacement to continue operation, but the data will be lost. Once all of the spare sectors have been used, grown defects can no longer be replaced. Reformatting the drive can replenish the spare sector pool at the cost of drive capacity and erasure of the stored data.

Figure 1:
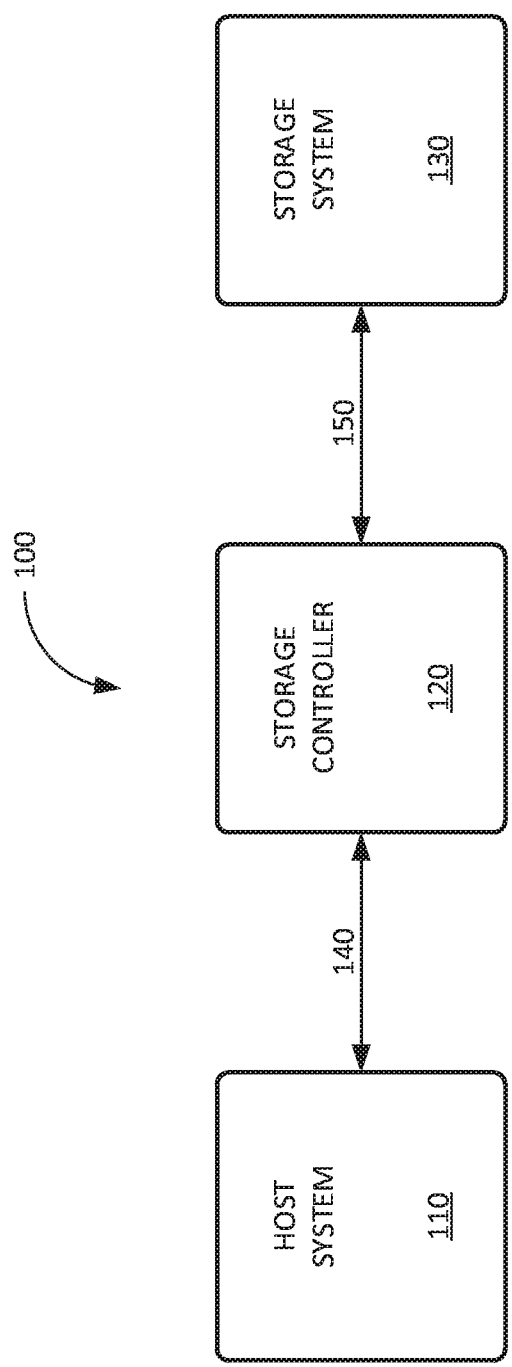
FIG. 1 illustrates a computer host and data storage system.

FIG. 1 illustrates computer host and data storage system 100. In this example embodiment, host system 110 sends data to, and receives data from, storage controller 120 for storage in storage system 130. In an example embodiment, storage system 130 comprises flash non-volatile memory, such as NAND memory. NAND memory is just one example, other embodiments of storage system 130 may comprise other types of storage. Storage controller 120 communicates with storage system over link 150, and performs the function of configuring data received from host system 110 into a format that efficiently uses the memory resources of storage system 130.

In this example, storage controller 120 provides data to storage system 130 using a sequential write/random read traffic flow. This traffic flow provides a number of advantages over the small data block random write/random read traffic flow typically used with flash non-volatile memory. In particular, the sequential write/random read traffic flow provides for efficient use of memory within the storage array and offers performance improvements such as programmable data partitions within storage system 130, including the use of multiple, bi-directional data streams that are mapped to different partitions within storage system 130. These partitions may be configured individually with a desired partition size, data block size, storage density, physical memory attributes, protection attributes, security level, quality of service requirements, data type, data source, data stream attributes, and the like.

Storage controller 120 provides translation between standard storage interfaces and command protocols used by host system 110 to a command protocol and the physical interface used by storage devices within storage system 130. Additionally, storage controller 120 may emulate different media types such as a hard disk drive, tape drive, or the like, allowing host system 110 to interface with storage system 130 as if it were a hard disk drive, tape drive, or the like. In such an emulation mode, storage controller 120 translates between host system 110 and storage system 130, configuring data traffic and translating commands between the format of the media type desired by host system 110 and the protocol used by storage system 130.

Within a single storage system 130 different partitions may be used to emulate different media types, with storage controller 120 managing the different data traffic streams and configuring the data, along with translating the commands in each stream as necessary.

Additionally, storage controller 120 implements error correction code (ECC) encode/decode functions, along with data encoding, data recovery, retry recovery methods, and other processes and methods to optimize data integrity. Storage controller 120 includes the ability to provide multi-level ECC correction over a wide range of data block sizes, allowing for the correction of data errors both large and small.

Further, storage controller 120 implements a Read After Write (RAW) verify method which allows storage medium defects and write errors to be detected immediately and corrected for. Current storage systems write blind and have to depend on medium product quality and test processes, ECC power and read retries for recover, and probability calculations making assumptions about the medium defect distributions in order to meet Uncorrectable Bit Error Rate (UBER) and reliability requirements.

For systems with blind write, there remains risk that grown defects or undetected write errors can defeat the ECC and read recovery algorithms—resulting in lost data. HDDs, SSDs, USB Flash, SD cards, and embedded eMMC (embedded Multi-Media Card)/UFS (Universal Flash Storage) flash controllers have this characteristic.

The RAW process eliminates any risk of data loss from silent write failures and grown medium defects prior to the data write. This also includes medium damage resulting from Program/Erase cycling, and the like. The only data corruption risk remaining is medium damage that occurred after the write or controller failure. This process is very significant in calculating the corrected UBER for the system.

Depending on the technology, a reduced margin verify can be performed during the RAW. This allows the controller to detect data that may be difficult to recover and rewriting it, resulting in additional reliability gain.

When operating only in RAW verify mode for sequential writes, there is no need for a bad block table. This simplifies the design as there is no need for searching the table and replacing blocks with spare blocks—including the indirection.

When RAW verify is used alone, there is no sparing table. No spare blocks need to be reserved for grown defects.

Since the RAW verify algorithm checks the medium as it is written, defect limits in manufacturing can be relaxed and still result in higher data reliability. The media technology still must be characterized to ensure that there is a minimum level of quality for it to be usable, but as long as it has enough quality to be stable, a very large number of defects can be dealt with.

Systems using sparing schemes must use media with a limited the number of defects plus some characterized probability that it will not exceed UBER rates due to medium defect bursts as well as not exceed the statistically defined spare block pool.

The method of bad block detection and management presented in this method can be combined with other methods to increase the overall robustness of bad block management.

Storage controller 120 may take any of a variety of configurations. In some examples, storage controller 120 may be a Field Programmable Gate Array (FPGA) with software, software with a memory buffer, an Application Specific Integrated Circuit (ASIC) designed to be included in a single module with storage system 130, a set of Hardware Description Language (HDL) commands, such as Verilog or System Verilog, used to create an ASIC, a separate module from storage system 130, built in to storage system 130, or any of many other possible configurations.

Host system 110 communicates with storage controller 120 over various communication links, such as communication link 140. These communication links may use the Internet or other global communication networks. Each communication link may comprise one or more wireless links that can each further include Long Term Evolution (LTE), Global System for Mobile Communications (GSM), Code Division Multiple Access (CDMA), IEEE 802.11 WiFi, Bluetooth, Personal Area Networks (PANs), Wide Area Networks, (WANs), Local Area Networks (LANs), or Wireless Local Area Networks (WLANs), including combinations, variations, and improvements thereof. These communication links can carry any communication protocol suitable for wireless communications, such as Internet Protocol (IP) or Ethernet.

Additionally, communication links can include one or more wired portions which can comprise synchronous optical networking (SONET), hybrid fiber-coax (HFC), Time Division Multiplex (TDM), asynchronous transfer mode (ATM), circuit-switched, communication signaling, or some other communication signaling, including combinations, variations or improvements thereof. Communication links can each use metal, glass, optical, air, space, or some other material as the transport media. Communication links may each be a direct link, or may include intermediate networks, systems, or devices, and may include a logical network link transported over multiple physical links. Common storage links include SAS, SATA, PCIe, Ethernet, Fiber Channel, Infiniband, and the like.

Storage controller 120 communicates with storage system 130 over link 150. Link 150 may be any interface to a storage device or array. In one example, storage system 130 comprises NAND flash memory and link 150 may use the Open NAND Flash Interface (ONFI) command protocol, or the "Toggle" command protocol to communicate between storage controller 120 and storage system 130. Other embodiments may use other types of memory and other command protocols. Other common low level storage interfaces include DRAM memory bus, SRAM memory bus, and SPI.

Link 150 can also be a higher level storage interface such as SAS, SATA, PCIe, Ethernet, Fiber Channel, Infiniband, and the like. However—in these cases, the RAW function would have to reside in the storage system as it has its own controller.

Figure 2:
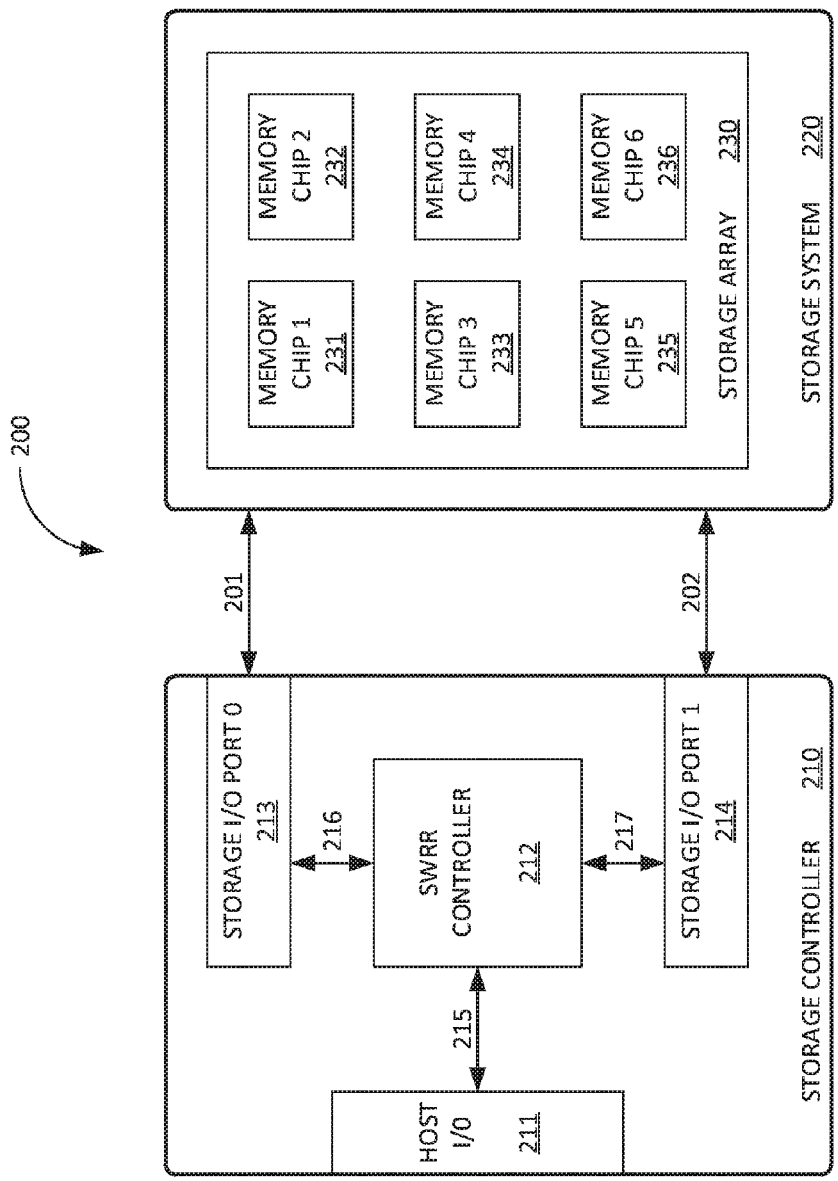
FIG. 2 illustrates a data storage system.

FIG. 2 illustrates data storage system 200. This example system comprises storage controller 210 and storage system 220. Storage system 220, comprises storage array 230. Storage array 230 comprises memory chips 1-6 (231-236). In an example embodiment, each memory chip 231-236 is a NAND memory integrated circuit. Other embodiments may use other types of memory.

Storage controller 210 comprises a number of blocks or modules including host I/O interface 211, sequential write/random read (SWRR) controller 212, storage I/O port 0 213, and storage I/O port 1 214. Sequential write/random read controller 212 communicates with the other blocks over links 215, 216, and 217. Storage I/O port 0 213 communicates with storage system 220 over link 201 and storage I/O port 1 214 communicates with storage system 220 over link 202.

In some example embodiments, storage I/O ports 0 and 1 (213 and 214) may use the Open NAND Flash Interface (ONFI) command protocol, or the "Toggle" command protocol to communicate with storage system 220 over links 201 and 201. The ONFI specification includes both the physical interface and the command protocol of storage I/O ports 0 and 1. The interface includes an 8-bit bus (in links 201 and 202) and enables storage controller 210 to perform read, program, erase, and other associated operations to operate memory chips 1-6 (231-236) within storage array 230.

Multiple memory chips may share each ONFI bus, however individual memory chips may not share multiple ONFI buses. Chips on one bus may only communicate with that bus. For example, memory chips 1-3 (231-233) may reside on bus 201, and memory chips 4-6 (234-236) may reside on bus 202.

In this example, sequential write/random read controller 212 receives host data from a host through host I/O interface 211 over link 215. Sequential write/random read controller 212 configures the data as needed for storage in storage system 220 and transfers the data to storage I/O ports 0 and 1 (213 and 214) for transfer to storage system 220 over links 201 and 202.

Figure 3:
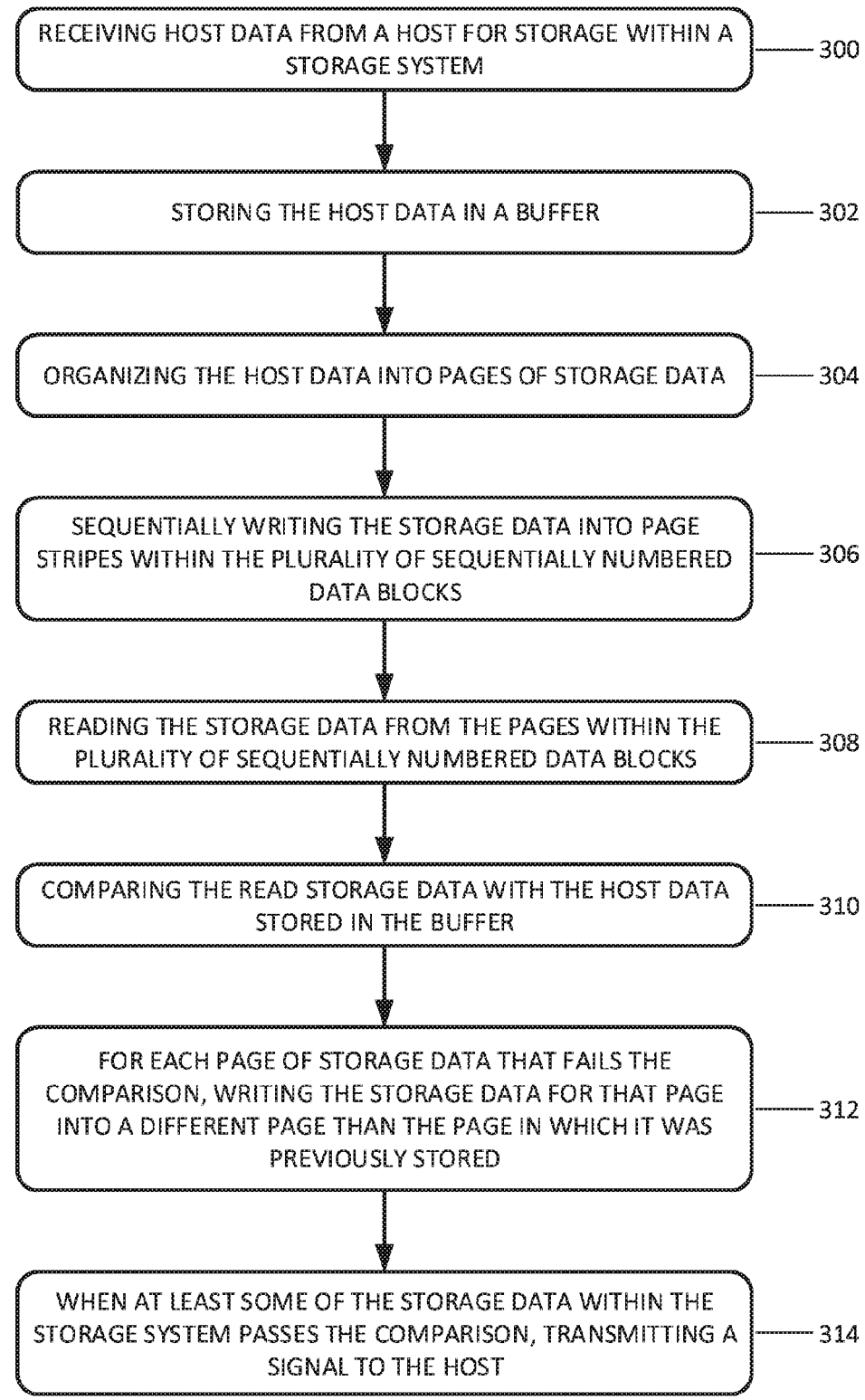
FIG. 3 illustrates a method for operating a storage controller.

FIG. 3 illustrates a method for operating storage controller 210 as illustrated in FIG. 2. Storage controller 210 receives host data from host system 110, through host I/O interface 211, for storage within storage system 220, (operation 300). The storage system is configured to store data in a plurality of sequentially numbered data blocks, each data block comprising a plurality of pages. Note that the size and physical configuration of pages and data blocks will vary according to the type of physical memory within storage system 220. Here data block refers to a portion of the physical memory within storage system 220, and page refers to a portion of a data block.

Storage controller 210 stores the host data in a data buffer, (operation 302). Storage controller 210 organizes the host data into pages of storage data, (operation 304).

Storage controller 210 sequentially writes the storage data into page stripes within the plurality of sequentially numbered data blocks through storage I/O ports 0 and 1 (213 and 214) using a sequential write/random read traffic model, (operation 306). Storage controller 210 then reads back the storage data from the pages within the plurality of sequentially numbered data blocks through storage I/O ports 0 and 1 (213 and 214), (operation 308).

Storage controller 210 compares the read storage data with the host data stored in the data buffer, (operation 310). For each page of storage data that fails the comparison, storage controller 210 writes the storage data for that page into a different page than the page in which it was previously stored, (operation 312). When at least some of the storage data within storage system 220 passes the comparison, storage controller transmits a signal to host system 110 through host I/O interface 211, (operation 314). In some embodiments, this signal transmitted to host system 110 is a write acknowledge.

In this example embodiment, storage system 220 comprises NAND flash memory, however, other embodiments may use other memory types. NAND flash drives include Solid-State Drives (SSDs), USB memory sticks, Secure Digital (SD) cards, eMMC (embedded Multi-Media Card)/UFS (Universal Flash Storage) embedded controllers, and the like. Defect management for these devices is very similar to the HDD process described above.

Figure 4:
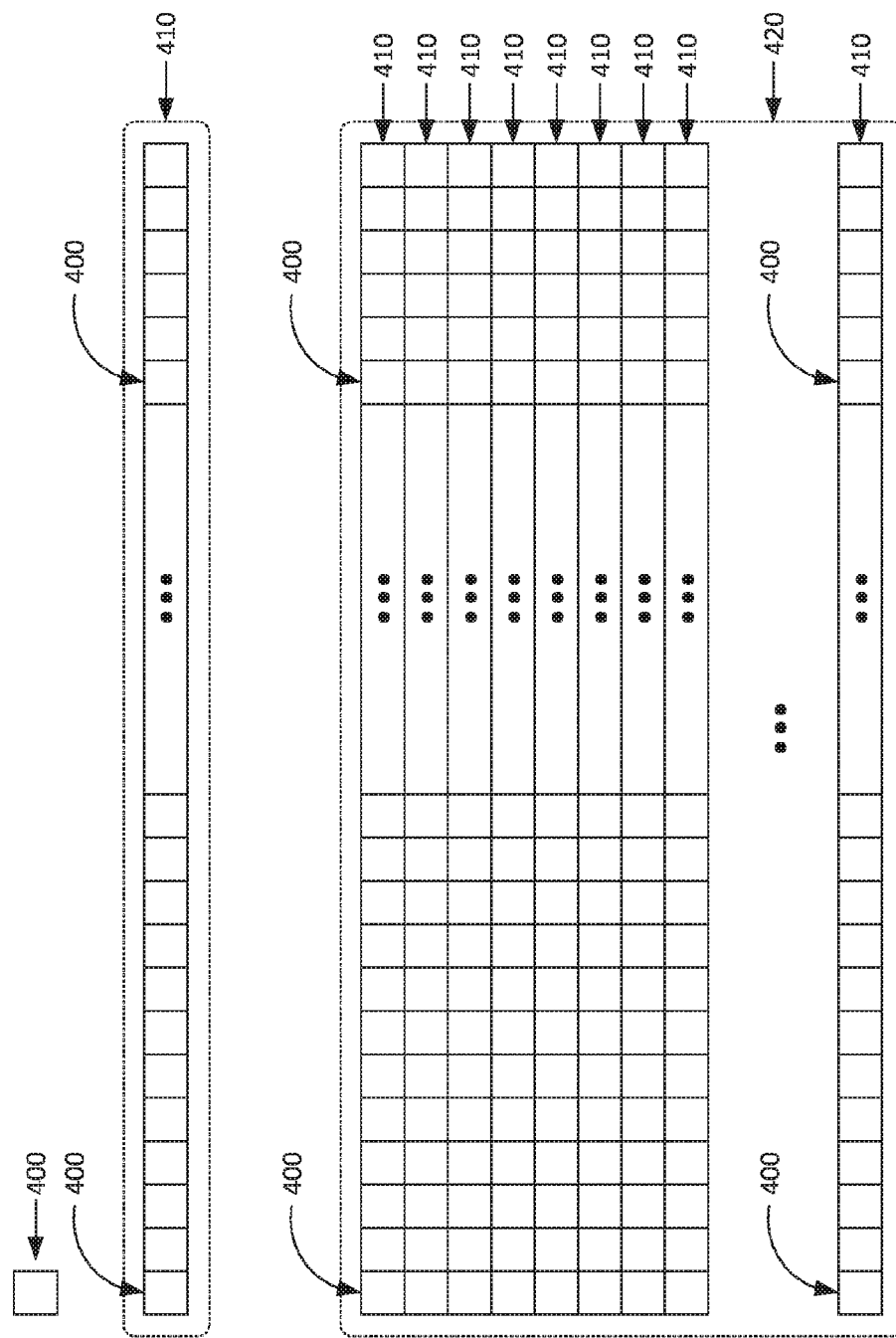
FIG. 4 illustrates an example of memory storage cell organization.

FIG. 4 illustrates an example of data storage cell organization. A NAND flash storage assembly includes a controller and an array of NAND devices. The assembly can be fixed in a system or removable. NAND flash non-volatile storage systems are organized as an array of memory cells 400 surrounded by control logic to allow it to be programmed, read, and erased. The cells in a typical flash array are organized in pages 410 for program and read operations. Multiple pages 410 are in a data (NAND) block 420 and usually must be written sequentially within a data block 420. Erase operations are done on a data block 420 basis.

Figure 5:
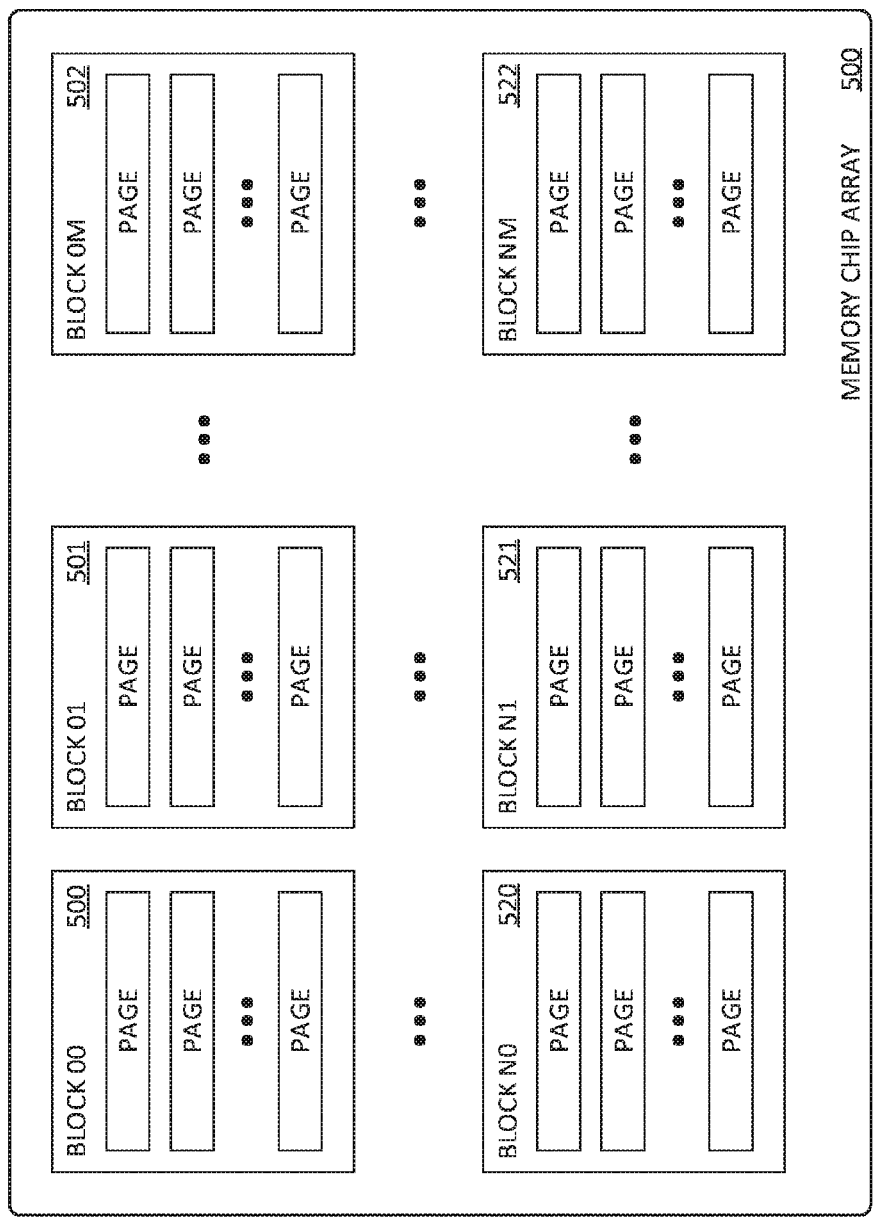
FIG. 5 illustrates a memory chip array.

FIG. 5 illustrates memory chip array 500. Memory chip array 500 within a die (chip/integrated circuit) comprises multiple data (NAND) blocks 500-522. The page 410, data block 420 and array 500 sizes vary by flash die design. Typical sizes are currently 16 KB pages, 512 pages per data block, and 1024 data blocks per die. These sizes continue to grow as memory die increase capacity. For SSDs, the host blocks are 512 bytes in size and are mapped into pages.

The memory chip array 500, when using NAND flash memory data cells, may be controlled externally by the industry standard ONFI (Open NAND Flash Interface) specification or the "Toggle" interface specification. The ONFI specification includes both the physical interface and the command protocol. The interface has an 8-bit bus and enables a controller to perform program, read, erase, and associated operations to operate the NAND die. Multiple die can share an ONFI bus.

Most NAND memory systems are built out of an array of NAND die to increase performance and capacity. Multiple NAND die can be packaged together, multiple packages can be assembled together on assemblies, and multiple assemblies can exist within a NAND memory system. The entire set of NAND memory being controlled is referred to as the storage array.

In order to use NAND memory in a system, a storage controller is required. The controller has many functions including, but not limited to: converting between ONFI and standard storage interfaces and command protocols, organizing data across the storage array, adding metadata and/or tables to keep track of the data written and where it is mapped in the array, implementing ECC encode/decode, data encoding, recovery, retry recovery algorithms, and other processes and algorithms to optimize data integrity, and NAND and array management functions to optimize storage usage, capacity, performance, life, and power.

The medium defect management for NAND flash storage is very similar to HDD except that blocks are mapped out instead of sectors. The major differences between NAND flash defect mapping and HDD mapping are that the pages within a flash block must be written sequentially, and that blocks are much larger than host logical blocks. SSDs also include a system area and sparing area.

During manufacturing test, the blocks in the NAND array are tested and those with too many errors are marked as bad. This is done by leaving a special pattern in the bad block, by creating a table in the system area, or both.

As stated above, the pages within a NAND block must be written sequentially. That makes the array act as a sequential write device—at least within blocks.

Figure 6:
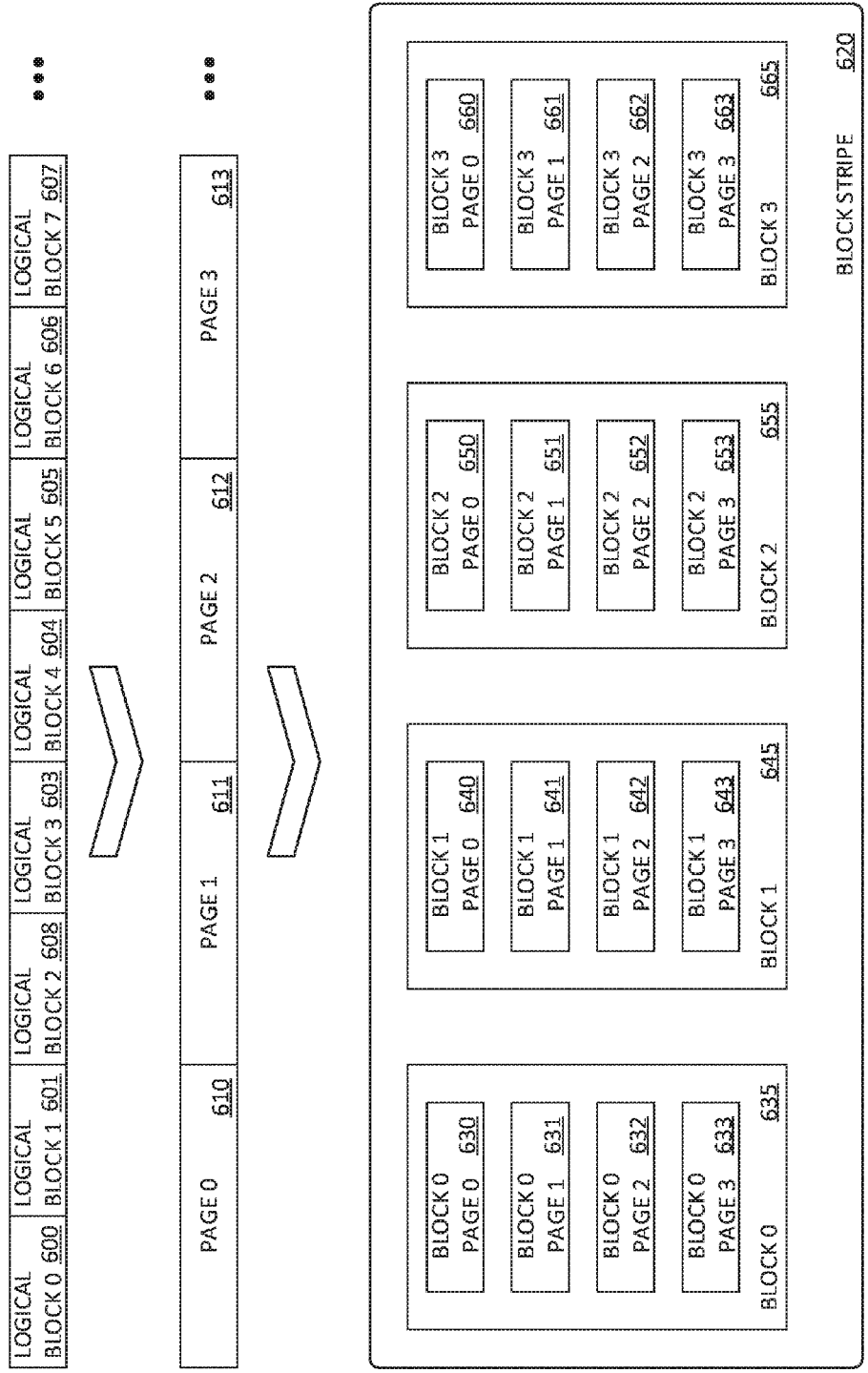
FIG. 6 illustrates a method for input data stream mapping.

FIG. 6 illustrates a method for input data stream mapping in a NAND flash without defects using a SWRR controller. FIG. 6 shows a write data stream flowing in sequential logical blocks numbered 0-7 and continuing. The input logical blocks are mapped into an input page stream to fit it to the NAND storage array. In this example, 8 logical blocks fit into each input page. Other embodiments using other types of physical memory may use other sizes of logical blocks and input pages.

In this example, the first 8 input logical blocks 600-607 are illustrated. These input logical blocks 600-607 are mapped into an input page stream of which the first four input pages 610-613 are illustrated. This input page stream is then mapped into block stripe 620. In this example logical blocks 0-7 (600-607) map into page 0, logical blocks 8-15 (not illustrated) map into page 1, logical blocks 16-23 (not illustrated) map into page 2, and so forth. Page 0 maps into block0/page0, page 1 maps into block 1/page 0, page 2 maps into block2/page 0, and so forth.

In this example, block stripe 620 includes four blocks, block 0 635, block 1 645, block 2 655, and block 3 665. Each block includes four pages. Block 0 635 includes page 0 630, page 1 631, page 2 632, and page 3 633. Block 1 645 includes page 0 640, page 1 641, page 2 642, and page 3 643. Block 2 655 includes page 0 650, page 1 651, page 2 652, and page 3 653. Block 3 665 includes page 0 660, page 1 661, page 2 662, and page 3 663.

Figure 7:
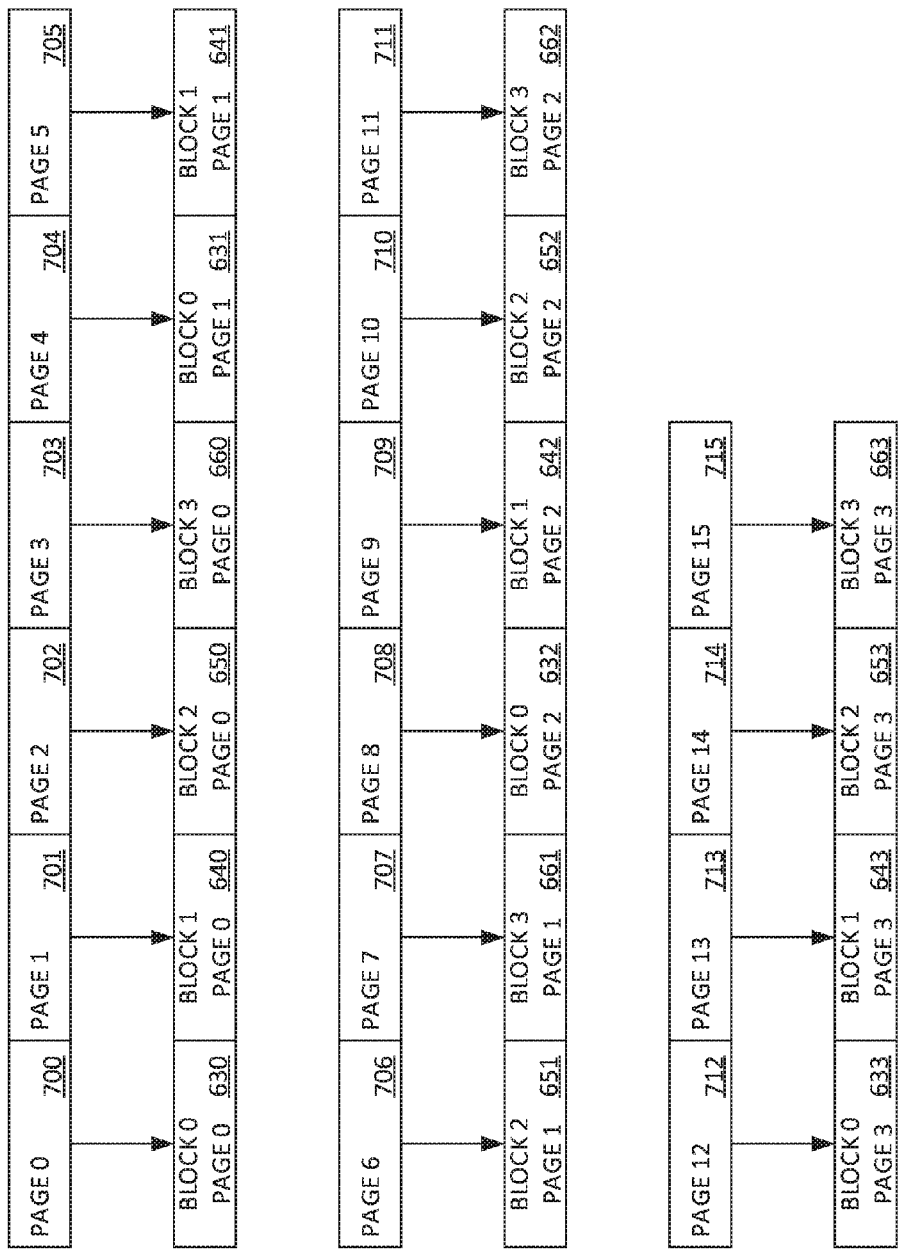
FIG. 7 illustrates a method for input page stream to block stripe mapping.

FIG. 7 illustrates a method for input page stream to block stripe mapping. In this example, the input page stream of FIG. 6 is mapped into block stripe 620 in page stripes. Here, 16 pages 700-715 of the input page stream are illustrated and mapped into the 16 pages contained within block stripe 620 in page stripes.

Input page 0 700 is mapped into block 0/page 0 630. Input page 1 701 is mapped into block 1/page 0 640. Input page 2 702 is mapped into block 2/page 0 650. Input page 3 703 is mapped into block 3/page 0 660. Input page 4 704 is mapped into block 0/page 1 631. Input page 5 705 is mapped into block 1/page 1 641. Input page 6 706 is mapped into block 2/page 1 651. Input page 7 707 is mapped into block 3/page 1 661. Input page 8 708 is mapped into block 0/page 2 632. Input page 9 709 is mapped into block 1/page 2 642. Input page 10 710 is mapped into block 2/page 2 652. Input page 11 711 is mapped into block 3/page 2 662. Input page 12 712 is mapped into block 0/page 3 633. Input page 13 713 is mapped into block 1/page 3 643. Input page 14 714 is mapped into block 2/page 3 653. Input page 15 715 is mapped into block 3/page 3 663. If a block is marked out as bad, a block from the bad block pool replaces it.

The read process is straightforward. Using the table that maps the logical blocks to block/page addresses, it determines what physical page(s) to read to retrieve the requested data. Read errors and marginal reads are handled the same way as for hard-disk drives, except an entire block is replaced by a spare block.

Utilizing a Read After Write (RAW) verify method for storing data in NAND flash, pages having physical defects may be avoided automatically, and the data stored in other pages. This method applies to storage systems that employ an integrated control function and write data sequentially. Systems fitting that model include NAND based devices (SSD, USB memory sticks, SD cards, and embedded flash (eMMC/UFS) as well as hard-disk drives using shingled recording.

The core of the method is the addition of RAW verify and handling defects and failed writes during the write process rather than waiting for a failure to be detected during a read when the recovery options are much more limited. The RAW (Read After Write) verify process involves immediately reading data after it is written to do a quality check of the data integrity. If the data fails the check, it is rewritten to greatly increase the chance of recovery when it is read.

The method is not mutually exclusive from the standard bad block mapping algorithms described in the background section of this document. The defect mapping processes are compatible and can work together for added robustness.

The RAW verify method, when used for sequential media, does not employ a sparing area. It works on any storage system requiring an integrated controller that operates in a sequential data storage mode. It also does not employ manufacturing defect scans and mapping out of defective blocks, format operations, or any other preparation relating to bad blocks prior to the first write.

Referencing FIG. 6, host blocks are received and packed into an input stream of pages. A block stripe is selected and opened for writing. The length of the block stripe is variable and based on the system configuration.

After each page from the input data stream is written, it is read back for verification prior to releasing the data buffer containing the page data. If the verification fails, the page is queued for rewrite at the next page position in the same block.

The read-back verification can be a straight data compare, an ECC check, or, for enhanced reliability, it can be a threshold read that is done with tighter read thresholds than a normal read to further ensure that the write was completed successfully and with good margin. For NAND cells a threshold read reads out the cell voltages and checks the margins against the read thresholds. For HDD sectors a threshold read reads out the drive head's analog voltage signal and compares it to expected curve fits based on the data pattern. It fails if it falls outside of a curve fit threshold band.

Each page has metadata stored with it that includes, among other information, the page sequence number and the page write count. The first time a page is written, its write sequence number is 0. The write sequence number is incremented each time the page is rewritten until a retry limit is hit.

Figure 8:
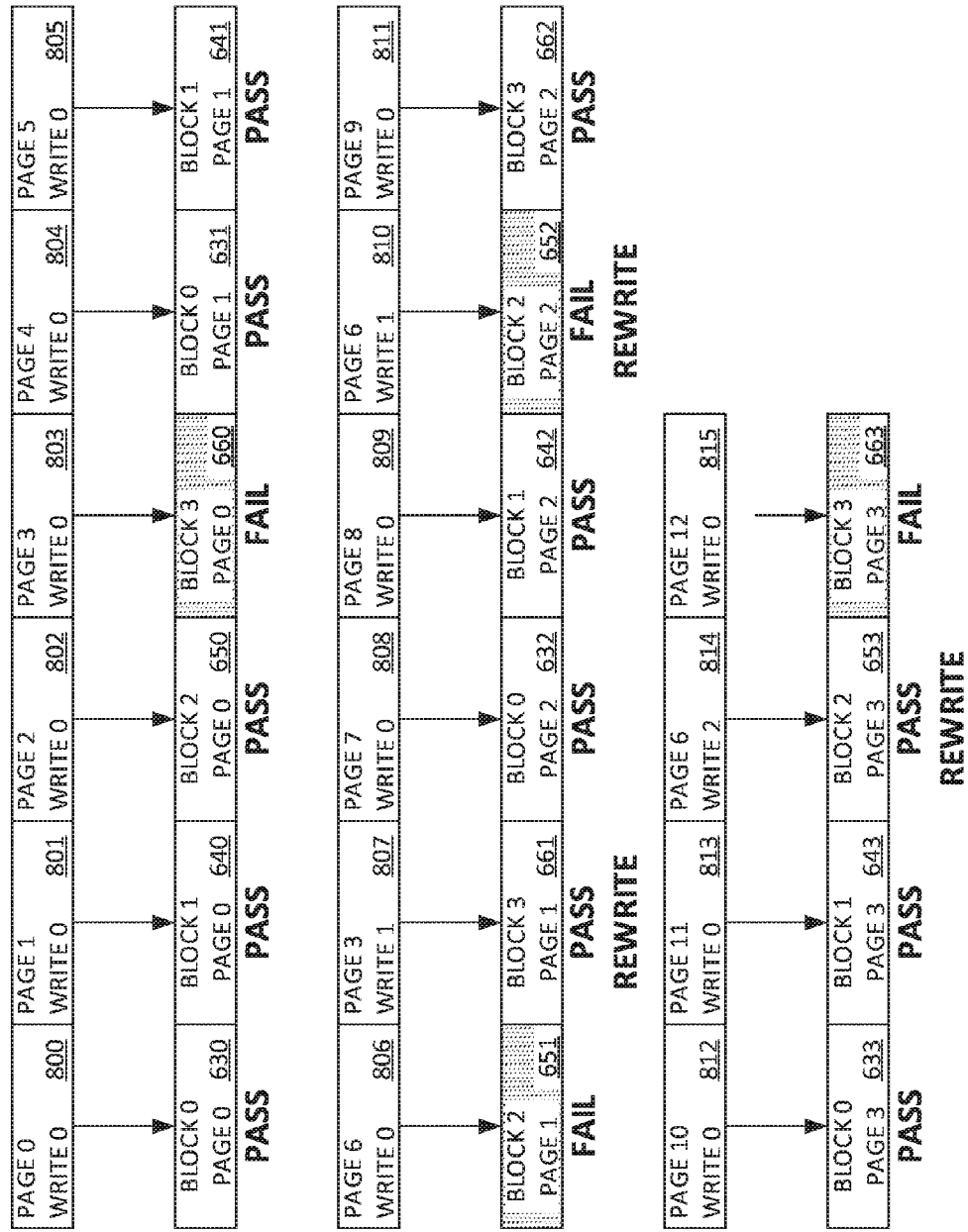
FIG. 8 illustrates a method for input page stream to block stripe mapping with rewrites.

Referring back to the example of FIG. 6, with a block stripe width of 4 and 4 pages per block, the following example illustrated in FIG. 8 shows some RAW failures and their handling.

FIG. 8 illustrates a method for input page stream to block stripe mapping with rewrites. In this example, an input page stream comprising 13 pages is to be mapped into block stripe 620 of FIG. 6. However, in this example some of the pages within block stripe 620 have physical defects.

Input page 0 is written into block 0/page 0 630 and then read back. It passes and is illustrated as page 0/write 0 800 with a PASS. The "write 0" notation refers to the fact that this is the first try at writing page 0 into block stripe 620. If a write fails, and the input page is to be written into a different block the "write 0" notation is incremented to "write 1", and so on for each subsequent write.

Input page 1 is written into block 1/page 0 640 and then read back. It passes and is illustrated as page 1/write 0 801. Input page 2 is written into block 2/page 0 650 and then read back. It passes and is illustrated as page 2/write 0 802. Input page 3 is written into block 3/page 0 660 and then read back. It fails and is illustrated as page 3/write 0 803 since this was the first try at writing input page 3. Since input page 3 has failed it is returned to the write queue and will be written again later into the next stripe within block stripe 620.

In other examples, input page 3 may be written into locations other than the next stripe within the same block. Depending on queue sizes, buffer sizes, amount of write traffic, and the like, it may be more efficient to rewrite input page 3 into a different location.

Input page 4 is written into block 0/page 1 631 and then read back. It passes and is illustrated as page 4/write 0 804. Input page 5 is written into block 1/page 1 641 and then read back. It passes and is illustrated as page 5/write 0 805. Input page 6 is written into block 2/page 1 651 and then read back. It fails and is illustrated as page 6/write 0 806 since this was the first try at writing input page 6. Since input page 6 has failed it is returned to the write queue and will be written again later into a different page within block stripe 620.

At this point, input page 3 comes to the front of the write queue and is written into block 3/page 1 661 and then read back. It passes rewrite and is illustrated as page 3/write 1 807 since this is the second try at writing input page 3. Input page 7 is written into block 0/page 2 632 and then read back. It passes and is illustrated as page 7/write 0 808. Input page 8 is written into block 1/page 2 642 and then read back. It passes and is illustrated as page 8/write 0 809.

At this point, input page 6 comes to the front of the write queue and is written into block 2/page 2 652 and then read back. It fails rewrite and is illustrated as page 6/write 1 810 since this is the second try at writing input page 6. Since input page 6 has failed it is returned to the write queue and will be written again later into a different page within block stripe 620. Input page 9 is written into block 3/page 2 662 and then read back. It passes and is illustrated as page 9/write 0 811. Input page 10 is written into block 0/page 3 633 and then read back. It passes and is illustrated as page 10/write 0 812. Input page 11 is written into block 1/page 3 643 and then read back. It passes and is illustrated as page 11/write 0 813.

At this point, input page 6 comes to the front of the write queue and is written into block 2/page 3 653 and then read back. It passes rewrite and is illustrated as page 6/write 2 814 since this is the third try at writing input page 6. Input page 12 is written into block 3/page 3 663 and then read back. It passes and is illustrated as page 12/write 0 815.

In this example, since the data is written as page stripes within block stripe 620, when a read after write fails the input page is queued such that it will attempt to write to the next page in the same block during the next page stripe write. In FIG. 8, input page 3 fails verify at block 3/page 0 and is rewritten successfully at block 3/page 1. Input page 6 fails verify at block 2/page 1 and is rewritten at block 2/page 2. That also fails and it is again rewritten at block 2/page 3—this time successfully. Input page 12 fails verify at block 3/page 3 and is queued to be rewritten in the next block stripe. In other examples, pages failing verify may be rewritten into other pages, not necessarily the next page in the same block.

This process continues until the medium is filled. Additional blocks may be reserved at the end of the storage array to account for potential rewrites at the end of the data area.

This method does not employ the bad block mapping done during manufacturing test of the array. Since it verifies every write, it still detects manufacturing defects and protects them with rewritten data.

If there are good pages in the mapped out bad blocks they can still be used. Also, the method duplicates data in-line with the sequential array organization rather than having to map it in spare blocks from a physically separate area of the storage array. This simplifies the storage array mapping and reduces the physical distance of rewrites compared to a sparing algorithm. It typically uses algorithms and calculations to locate rewrites rather than table searches.

However, if all pages within a block fail RAW verify, the method can result in multiple page rewrites and pushes the data intended for that block to the next block stripe. If bad blocks are not clustered and sparse, this has little effect on overall performance.

Figure 9:
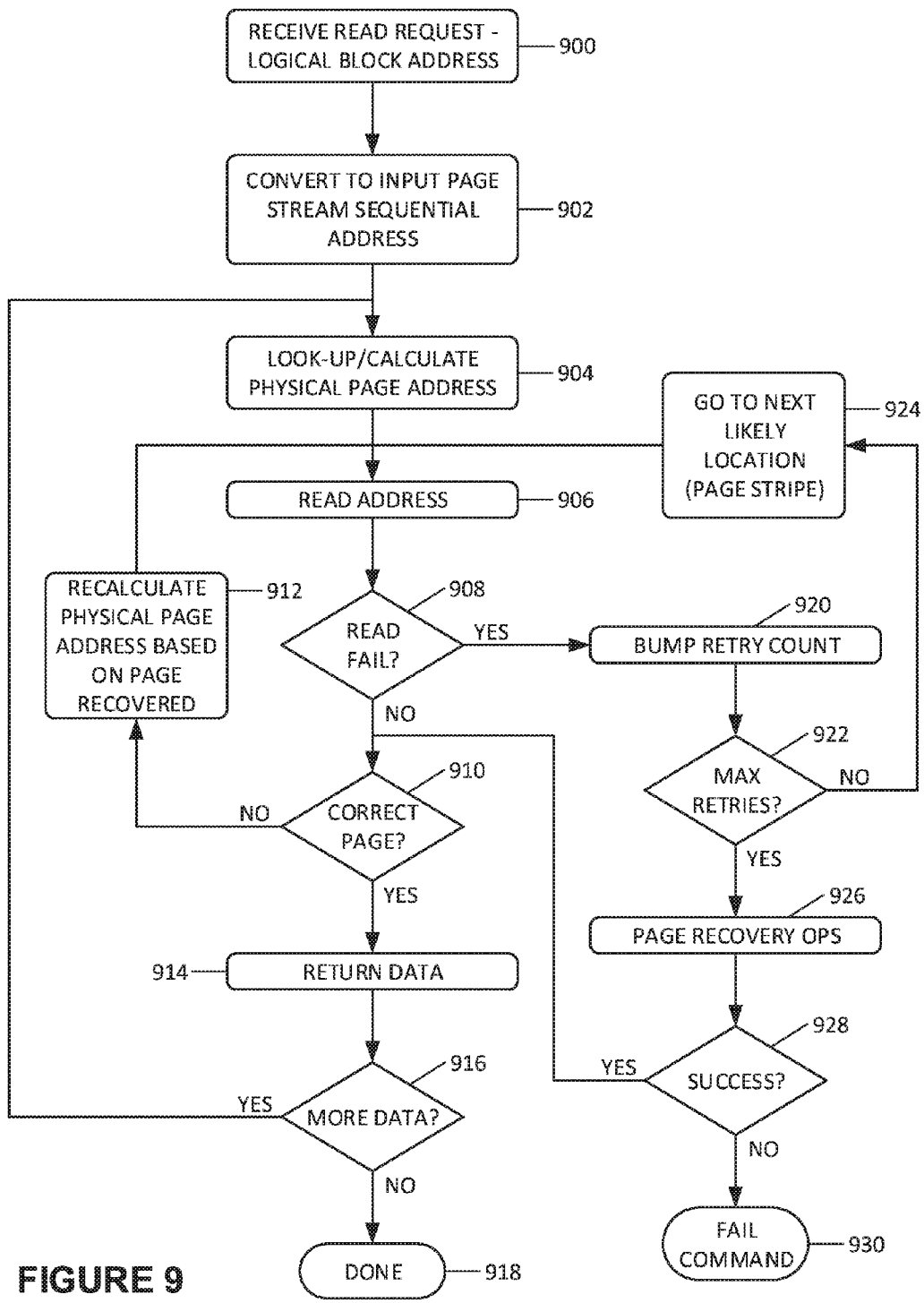
FIG. 9 illustrates a read method for verifying rewrites.

FIG. 9 illustrates a read method for verifying rewrites. Sequential reads are treated slightly differently than random reads. Briefly, for sequential reads, the host requests a relative position or logical block number to start the read from accompanied by a block count. In response, the controller calculates or looks up the physical page(s) that contain the requested data. Depending on the granularity of the table and/or algorithm, the calculated physical read page may not be exactly correct due to rewrites.

Referring now to FIG. 9, in detail, when a read request is received, (operation 900), the logical block address is translated into a sequential page address, (operation 902). Based on the storage array layout and block stripe sizes (or using a table), the most likely physical address is looked up or calculated, (operation 904). That address is read, (operation 906).

If the read fails, (decision operation 908), the read retry count is incremented (bumped), (operation 920) and checked, (decision operation 922). If the maximum number of retries has been reached, page recovery operations are started, (operation 926). Page recovery operations include ECC recovery and/or retries. If those operations fail, (decision operation 928), the read fails, (operation 930). If the recovery is successful, (decision operation 928), it moves to decision operation 910 and checks the page read for the correct address as described below. If the maximum number of read retries has not been exceeded, it calculates the next likely physical address for the target page (a page stripe slip), (operation 924), it moves to operation 906 and tries again to read that address.

The method checks page reads for the correct address, (decision operation 910). If it was the wrong page, it recalculates a new target address based on the page address just read and what is known about the array, (operation 912), then moves to operation 906 and tries again to read that address. If it was the correct page, it returns the data, (operation 914). If there is more data to read, (decision operation 916), it moves back to operation 904 and starts the method over. Otherwise, it has completed, (operation 918).

The Read After Write (RAW) method used for random media employs a sparing area. For random writes, the RAW verify operation is performed after every write, as it is for sequential operation. The difference for random write support is that a sparing area is added for the rewrites and the controller keeps track of the location and sequence of the sparing area. There are many ways of organizing and managing the location and contents of the sparing area.

For random RAW verify, the same metadata including the page sequence number and write count are used as for sequential RAW verify writes.

The primary difference between sequential and random writes is that when a random RAW verify write fails, the rewrite sequence number is incremented and the page is rewritten to the sparing area. Subsequent rewrite failures are also written to the sparing area.

The allocation, sequencing, and usage of the sparing area is not defined by this example. Many options can be used as long as there is an algorithmic or table method to allow the controller to locate rewritten pages during reads.

As with the sequential RAW verify method, a priori bad block mapping is not required.

The random read process is the same as for sequential. The only difference is that the rewrites are located in the sparing area instead of in the next page stripe.

The method for determining where a rewritten page changes to accommodate rewrites in the sparing area. It may be advantageous to include a locator table listing the pages that have been rewritten and where instead of doing a search and not knowing if there is a second copy of the failed page.

A defect management algorithm such as the one described above can easily combined with the RAW verify algorithm. In order to do this, either a bad block table is created in the system area or when block stripes are opened for writing, a pre-read check is done on each block to see if is bad.

When opening a block stripe, if there are any bad blocks in the targeted stripe (based on the bad block table or the pre-read), the bad blocks are replaced by remaining free blocks. The selection of the replacement blocks is based on the array and controller and is beyond the scope of this example. From there, the write and read processes are identical except for the bad block replacement is taken into account in the address calculations done in the read algorithm.

There are several advantages of this method over the RAW only method. It doesn't try to write into known bad blocks. It is much less likely that the write retry will be invoked. Block replacements can be well controlled and page stripes are more likely to stay intact. If a block was marked as defective, but was marginal in manufacturing this method will not try to use it.

Figure 10:
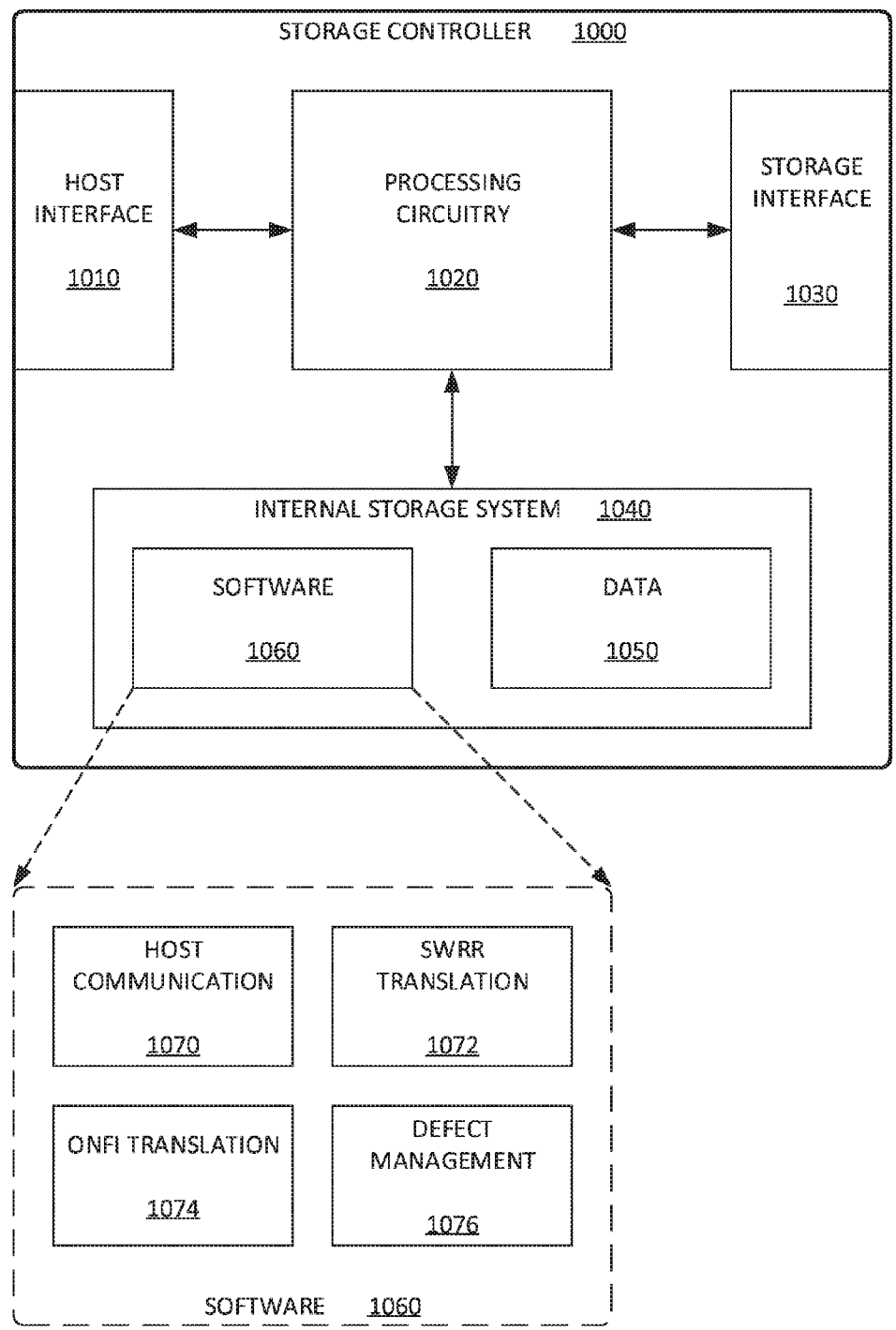
FIG. 10 illustrates a storage controller.

FIG. 10 illustrates storage controller 1000. As discussed above, storage controller 1000 may take on any of a wide variety of configurations. Here, an example configuration is provided for a storage controller implemented as an ASIC. However, in other examples, storage controller 1000 may be built into a storage system or storage array, or into a host system.

In this example embodiment, storage controller 1000 comprises host interface 1010, processing circuitry 1020, storage interface 1030, and internal storage system 1040. Host interface 1010 comprises circuitry configured to receive data and commands from an external host system and to send data to the host system. In some embodiments, host interface 1010 or processing circuitry 1020 may include a media emulation layer.

Storage interface 1030 comprises circuitry configured to send data and commands to an external storage system and to receive data from the storage system. In some embodiments storage interface 1030 may include ONFI ports for communicating with the storage system.

Processing circuitry 1020 comprises electronic circuitry configured to perform the tasks of a SWRR controller as described above. Processing circuitry 1020 may comprise microprocessors and other circuitry that retrieves and executes software 1060. Processing circuitry 1020 may be embedded in a storage system in some embodiments. Examples of processing circuitry 1020 include general purpose central processing units, application specific processors, and logic devices, as well as any other type of processing device, combinations, or variations thereof. Processing circuitry 1020 can be implemented within a single processing device but can also be distributed across multiple processing devices or sub-systems that cooperate in executing program instructions.

Internal storage system 1040 can comprise any non-transitory computer readable storage media capable of storing software 1060 that is executable by processing circuitry 1020. Internal storage system 1020 can also include various data structures 1050 which comprise one or more databases, tables, lists, or other data structures, including the data buffer used to temporarily store the storage data for comparison with the storage data read back from storage system 220. Storage system 1040 can include volatile and nonvolatile, removable and non-removable media implemented in any method or technology for storage of information, such as computer readable instructions, data structures, program modules, or other data.

Storage system 1040 can be implemented as a single storage device but can also be implemented across multiple storage devices or sub-systems co-located or distributed relative to each other. Storage system 1040 can comprise additional elements, such as a controller, capable of communicating with processing circuitry 1020. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that can be accessed by an instruction execution system, as well as any combination or variation thereof.

Software 1060 can be implemented in program instructions and among other functions can, when executed by storage controller 1000 in general or processing circuitry 1020 in particular, direct storage controller 1000, or processing circuitry 1020, to operate as described herein for a storage controller. Software 1060 can include additional processes, programs, or components, such as operating system software, database software, or application software. Software 1060 can also comprise firmware or some other form of machine-readable processing instructions executable by elements of processing circuitry 1020.

In at least one implementation, the program instructions can include host communication module 1070, SWRR translation module 1072, ONFI translation module 1074, and defect management module 1076.

Host communication module 1070 interfaces with a host system to provide host data and commands to storage controller 1000 for conversion into storage data and commands usable by a storage system. SWRR translation module 1072 translates host data and commands into data and commands usable by a storage system. ONFI translation module 1074 translates SWRR commands into ONFI commands for use by a storage system. Defect management module 1076 performs defect management using the Read After Write method described above.

In general, software 1060 can, when loaded into processing circuitry 1020 and executed, transform processing circuitry 1020 overall from a general-purpose computing system into a special-purpose computing system customized to operate as described herein for a storage controller, among other operations. Encoding software 1060 on internal storage system 1040 can transform the physical structure of internal storage system 1040. The specific transformation of the physical structure can depend on various factors in different implementations of this description. Examples of such factors can include, but are not limited to the technology used to implement the storage media of internal storage system 1040 and whether the computer-storage media are characterized as primary or secondary storage.

For example, if the computer-storage media are implemented as semiconductor-based memory, software 1060 can transform the physical state of the semiconductor memory when the program is encoded therein. For example, software 1060 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

What is claimed is:

1. A storage controller for a storage system, comprising:
 a host interface, configured to receive host data for storage within the storage system;
 a storage interface, configured to transmit storage data to the storage system using a sequential write/random read traffic model, the storage system configured to store data in a plurality of sequentially numbered data blocks, each data block comprising a plurality of pages wherein the sequential write/random read traffic model exclusively uses sequential writes and random reads; and
 processing circuitry coupled with the host interface and the storage interface, configured to:
  receive host data from a host, through the host interface, for storage within the storage system;
  store the host data in a data buffer;
  organize the host data into pages of storage data;
  sequentially write the storage data into page stripes within the plurality of sequentially numbered data blocks through the storage interface;

read the storage data from the pages within the plurality of sequentially numbered data blocks through the storage interface;
compare the read storage data with the host data stored in the data buffer;
for each page of storage data that fails the comparison, rewrite the storage data for that page into a different page than the page in which it was previously stored; and
when at least some of the storage data within the storage system passes the comparison, transmit a signal to the host through the host interface.

2. The storage controller of claim 1, wherein the processing circuitry is further configured to:
store in a memory a quantity of pages failing the comparison for each data block; and
lock out data blocks where the quantity of pages failing the comparison exceeds a threshold.

3. The storage controller of claim 1, wherein the processing circuitry is further configured to:
store in a memory an identity of pages failing the comparison; and
lock out pages failing the comparison.

4. The storage controller of claim 1, wherein the processing circuitry is further configured to:
for each page failing the comparison, determine one or more portions of the page failing the comparison; and
lock out those one or more portions of the page failing the comparison.

5. The storage controller of claim 1, wherein reading the storage data from the pages within the plurality of sequentially numbered data blocks comprises:
a threshold read performed with narrower read margins than a normal read.

6. The storage controller of claim 1, wherein the processing circuitry is further configured to:
store metadata within each page comprising a sequence number and a page write count for the data stored within the page.

7. The storage controller of claim 1, wherein the signal transmitted to the host is a write acknowledge.

8. A method of operating a storage controller, comprising:
receiving host data from a host, through a host interface, for storage within a storage system, the storage system configured to store data in a plurality of sequentially numbered data blocks, each data block comprising a plurality of pages;
storing the host data in a data buffer;
organizing the host data into pages of storage data;
sequentially writing the storage data into page stripes within the plurality of sequentially numbered data blocks through a storage interface using a sequential write/random read traffic model, wherein the sequential write/random read traffic model exclusively uses sequential writes and random reads;
reading the storage data from the pages within the plurality of sequentially numbered data blocks through the storage interface;
comparing the read storage data with the host data stored in the data buffer;
for each page of storage data that fails the comparison, rewriting the storage data for that page into a different page than the page in which it was previously stored; and
when at least some of the storage data within the storage system passes the comparison, transmitting a signal to the host through the host interface.

9. The method of claim 8, further comprising:
storing in a memory a quantity of pages failing the comparison for each data block; and
locking out data blocks where the quantity of pages failing the comparison exceeds a threshold.

10. The method of claim 8, further comprising:
storing in a memory an identity of pages failing the comparison; and
locking out pages failing the comparison.

11. The method of claim 8, further comprising:
for each page failing the comparison, determining one or more portions of the page failing the comparison; and
locking out those one or more portions of the page failing the comparison.

12. The method of claim 8, wherein reading the storage data from the pages within the plurality of sequentially numbered data blocks comprises:
a threshold read performed with narrower read margins than a normal read.

13. The method of claim 8, further comprising:
storing metadata within each page comprising a sequence number and a page write count for the data stored within the page.

14. The method of claim 8, wherein the signal transmitted to the host is a write acknowledge.

15. One or more non-transitory computer-readable media having stored thereon program instructions to operate a storage controller for a storage system, wherein the program instructions, when executed by processing circuitry, direct the processing circuitry to at least:
receive host data from a host, through a host interface, for storage within the storage system, the storage system configured to store data in a plurality of sequentially numbered data blocks, each data block comprising a plurality of pages;
store the host data in a data buffer;
organize the host data into pages of storage data;
sequentially write the storage data into page stripes within the plurality of sequentially numbered data blocks through a storage interface configured to transmit the storage data to the storage system using a sequential write/random read traffic model, wherein the sequential write/random read traffic model exclusively uses sequential writes and random reads;
read the storage data from the pages within the plurality of sequentially numbered data blocks through the storage interface;
compare the read storage data with the host data stored in the data buffer;
for each page of storage data that fails the comparison, rewrite the storage data for that page into a different page than the page in which it was previously stored; and
when at least some of the storage data within the storage system passes the comparison, transmit a signal to the host through the host interface.

16. The one or more non-transitory computer-readable media of claim 15, wherein the program instructions further direct the processing circuitry to at least:
store in a memory a quantity of pages failing the comparison for each data block; and
lock out data blocks where the quantity of pages failing the comparison exceeds a threshold.

17. The one or more non-transitory computer-readable media of claim 15, wherein the program instructions further direct the processing circuitry to at least:

store in a memory an identity of pages failing the comparison; and lock out pages failing the comparison.

18. The one or more non-transitory computer-readable media of claim 15, wherein the program instructions further direct the processing circuitry to at least:

for each page failing the comparison, determine one or more portions of the page failing the comparison; and lock out those one or more portions of the page failing the comparison.

19. The one or more non-transitory computer-readable media of claim 15, wherein reading the storage data from the pages within the plurality of sequentially numbered data blocks comprises:

a threshold read performed with narrower read margins than a normal read.

20. The one or more non-transitory computer-readable media of claim 15, wherein the program instructions further direct the processing circuitry to at least:

store metadata within each page comprising a sequence number and a page write count for the data stored within the page.

* * * * *